(12) United States Patent
Pätz et al.

(10) Patent No.: US 6,331,031 B1
(45) Date of Patent: Dec. 18, 2001

(54) SOLAR MOTOR VEHICLE ROOF

(75) Inventors: Werner Pätz, Hofstetten; Thomas Ganz, Stockdorf; Helmut Teschner, Finning; Reinhard Wecker, Eichenau, all of (DE)

(73) Assignee: Webasto Vehicle Systems International GmbH, Stockdorf (DE)

( * ) Notice: Subject to any disclaimer, the term of this patent is extended or adjusted under 35 U.S.C. 154(b) by 0 days.

(21) Appl. No.: 09/634,716

(22) Filed: Aug. 7, 2000

(30) Foreign Application Priority Data

Aug. 6, 1999 (DE) ................................. 199 37 221

(51) Int. Cl.⁷ ..................................................... B60J 7/043
(52) U.S. Cl. ............................................. 296/211; 296/214
(58) Field of Search ................................. 296/211, 214, 296/215, 216.06, 216.09

(56) References Cited

U.S. PATENT DOCUMENTS 5,076,634   12/1991   Müller et al. ..................... 296/97.5

FOREIGN PATENT DOCUMENTS

| 37 13 853 | 10/1987 | (DE) . |
| 37 13 854 | 10/1987 | (DE) . |
| 286 18 379 | 3/1997 | (DE) . |
| 393437 | * 10/1990 | (EP) ..................................... 296/211 |
| 459180 | * 12/1991 | (EP) ..................................... 296/214 |

* cited by examiner

*Primary Examiner*—Dennis H. Pedder
(74) *Attorney, Agent, or Firm*—Nixon Peabody LLP; David S. Safran

(57) ABSTRACT

A motor vehicle roof with a closure element (14) for a roof opening (12) which can be displaced between a closed position and an open position and which is provided with a primary solar generator (24). The closure element (14) is made such that an additional element (32) which has an additional solar generator (34) can be coupled to the closure element in the open position of the closure element, such that the additional element assumes a working position on the outside of the vehicle to generate solar current.

18 Claims, 3 Drawing Sheets

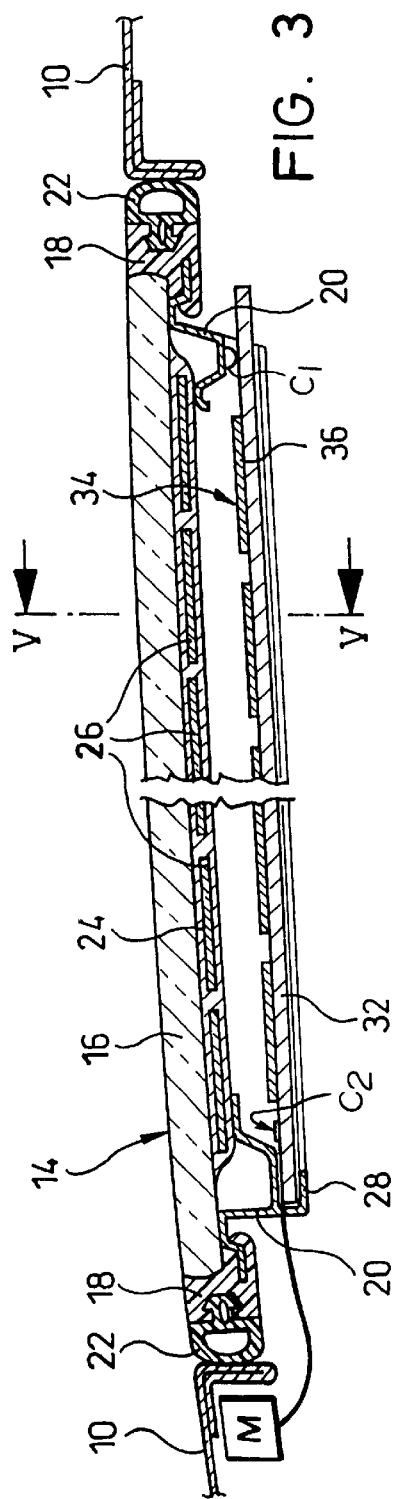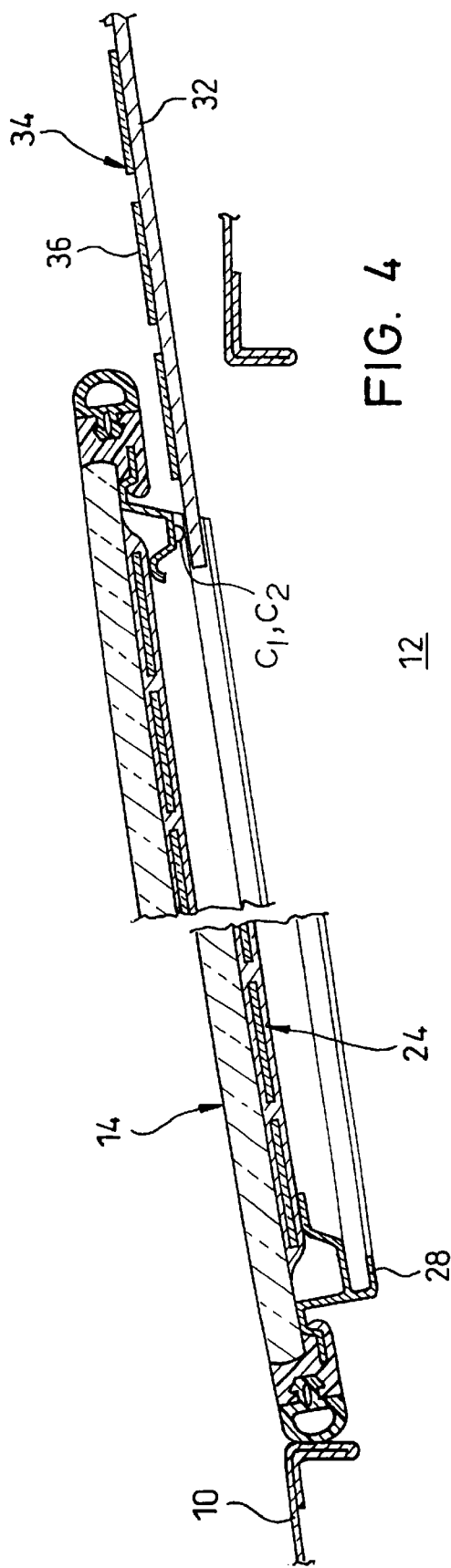

SOLAR MOTOR VEHICLE ROOF

BACKGROUND OF THE INVENTION

1. Field of the Invention

This invention relates to a solar motor vehicle roof with a closure element for a roof opening which forms a primary solar generator and which can is displaceable between a closed position and an open position

2. Description of Related Art

A generic motor vehicle roof of the initially mentioned type is known, for example, from published German Patent Application No. DE 37 13 854 A1, the closure element being formed by the cover of a spoiler roof. The cover comprises a transparent pane which on its outside is in part provided with a lining which renders it opaque and which is formed by solar cells. Underneath the cover there is a movable headliner which likewise bears solar cells on its top.

Published German Patent Application No. DE 37 13 853 A1 discloses a spoiler roof for motor vehicles in which there are solar cells on the bottom of the rear part of the spoiler cover or on a roof-mounted installation surface on the rear edge of the roof opening.

German Utility Model DE 296 18 379 U1 discloses a separate mobile solar module for motor vehicles which can be attached on the body or in the vehicle interior.

U.S. Pat. No. 5,076,634 discloses a solar module which is located in the interior of a motor vehicle and which is integrating into the front sun visor. The sun visor is made to unfold in two parts so that in its unfolded position the active surface of the solar module is enlarged.

SUMMARY OF THE INVENTION

The primary object of this invention is to devise a motor vehicle roof which offers the maximum possible solar-generated power at a production cost that is minimally increased relative to the increased power obtained.

It is a filter object of the invention to obtain the foregoing object without a solar generator in the interior of the vehicle.

These objects are achieved in accordance with the invention by a motor vehicle roof in which the closure element is provided with an additional element which has an additional solar generator that, in the open position of the closure element, can be coupled to the closure element such that the additional element assumes a working position on the outside of the vehicle to generate solar current.

In this approach, in accordance with the invention, it is advantageous that the active solar surface, and thus the generated solarpower of the solar generator, can be easily increased without the additional solar generator provided for this purpose needing to satisfy the requirements for permanently external motor vehicle parts, by which the increased production costs are low relative to the attained increase in solar power.

The closure element is preferably a cover which is raised in the open position at its rear edge. This can be the cover of a lifting roof, a spoiler roof, or a lifting and sliding roof To save money, the additional element is preferably made to operate only with the vehicle stationary.

The closure element and the additional element are preferably made such that, when the additional element is in the working position, an electrical contact between the closure element and the additional element is closed.

According to a first embodiment, the closure element and the additional element are also coupled to one another outside the working position of the additional element. Here, the additional element can be, preferably, a headliner part for concealing the cover from underneath, i.e. the cover which is movably guided on the bottom of the cover. With the cover closed, the headliner part is concealed from above by the cover, while the headliner part in the working position with the cover opened can be pushed so far to the rear that the additional solar generator is essentially no longer concealed by the cover.

According to one alternative embodiment, the closure element and the additional element are coupled to one another only in the working position of the additional element. The additional element and the cover are made such that the additional element in inserted manually from the rear into the cover when the cover is raised.

In the following, a preferred embodiment of the invention is explained by way of example using the accompanying drawings.

BRIEF DESCRIPTION OF THE DRAWINGS

FIG. 3 shows a sectional view along line III—III in FIG. 1;

FIG. 4 shows a sectional view of line IV—IV in FIG. 2; and

DETAILED DESCRIPTION OF THE INVENTION

Figure 1:
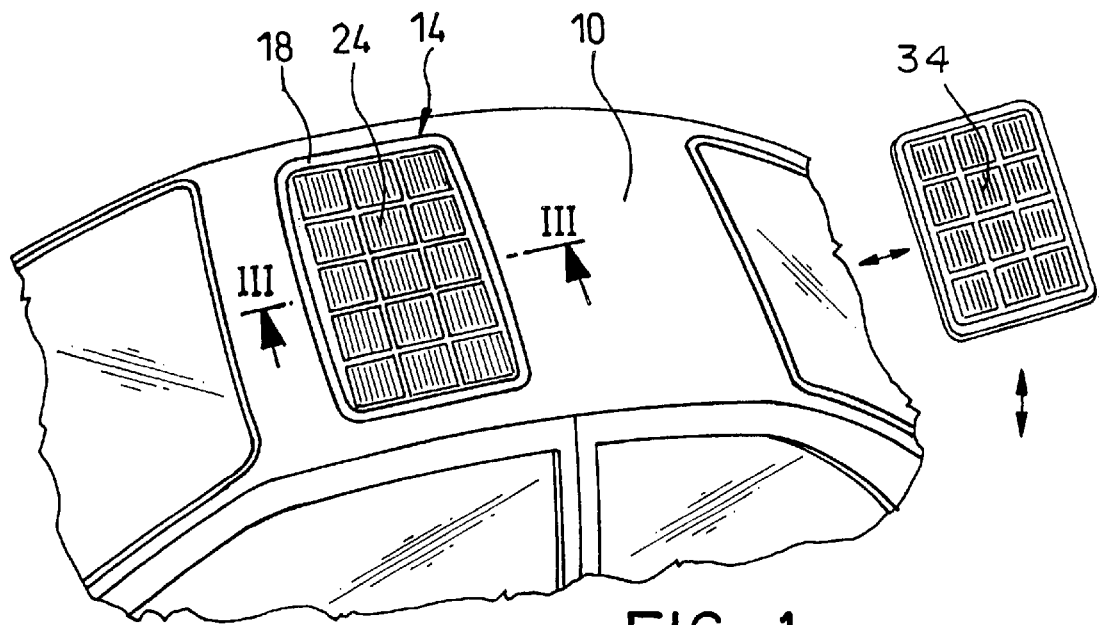
FIG. 1 is a perspective overhead view of a motor vehicle roof in accordance with the invention with the cover closed.

FIG. 1 shows a motor vehicle roof with a fixed roof skin 10 with a roof opening 12 which is closed by a cover 14. As shown in FIG. 3, the cover 14 comprises a transparent glass pane 16 which is peripherally covered by polyurethane foam 18 by means of which an inner cover sheet 20 is attached along the periphery of the glass pane 16 at its underside. Furthermore, the peripheral foam 18 is used to attach a seal 22 along the outside periphery of the cover 14. A solar module 24 which is preferably made as a film module and which comprises several solar cells 26 is mounted on the bottom of the glass pane 16. The inner cover sheet 20 is made such that, on the front edge of the cover 14, it forms a receiver 28 and with a guide rail 30 being provided on each of the two lengthwise sides of the cover 14 for a sliding headliner 32. The sliding headliner 32 comprises essentially an opaque carrier with an additional solar module 34 with several solar cells 36 on its top surface. The solar modules 24 and 34 each occupy most of the surface of the cover 14 and the sliding headliner 32, respectively.

In the closed position of the cover 14 which is shown in FIGS. 1 & 3, the sliding headliner 32 is located underneath the cover 14 in order to cover it from below with respect to the vehicle interior. Proceeding from the closed position which is shown in FIGS. 1 and 3, the cover 14 can be raised in the conventional manner at its rear edge in order to provide for a ventilation function for the motor vehicle interior.

After raising the cover 14, the sliding headliner 32 can be pushed in the guide rails 30 along the cover 14 to the rear over the fixed roof skin 10 in order to assume a working position in which the solar module 34 of the sliding headliner 32 is no longer concealed by the cover 14, see FIGS. 1 and 4. In this working position, an electrical contact between the cover 14 and the additional solar module 34 is closed (compare positions of contacts $C_1$, $C_2$ in FIGS. 3 & 4) so that the solar power generated by the additional solar module 34 can be relayed to the cover 14 which is conventionally in electrical contact with the corresponding power consumers in the motor vehicle, for example, a fan or the motor vehicle battery.

Figure 2:
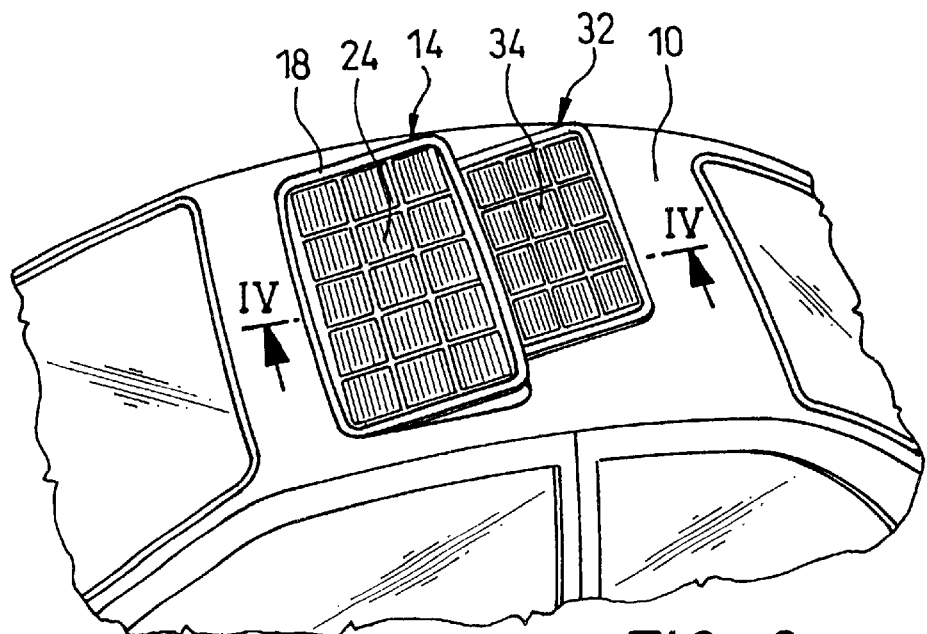
FIG. 2 is a view like FIG. 1, but with the cover opened and with the additional element in its working position.
Figure 5:
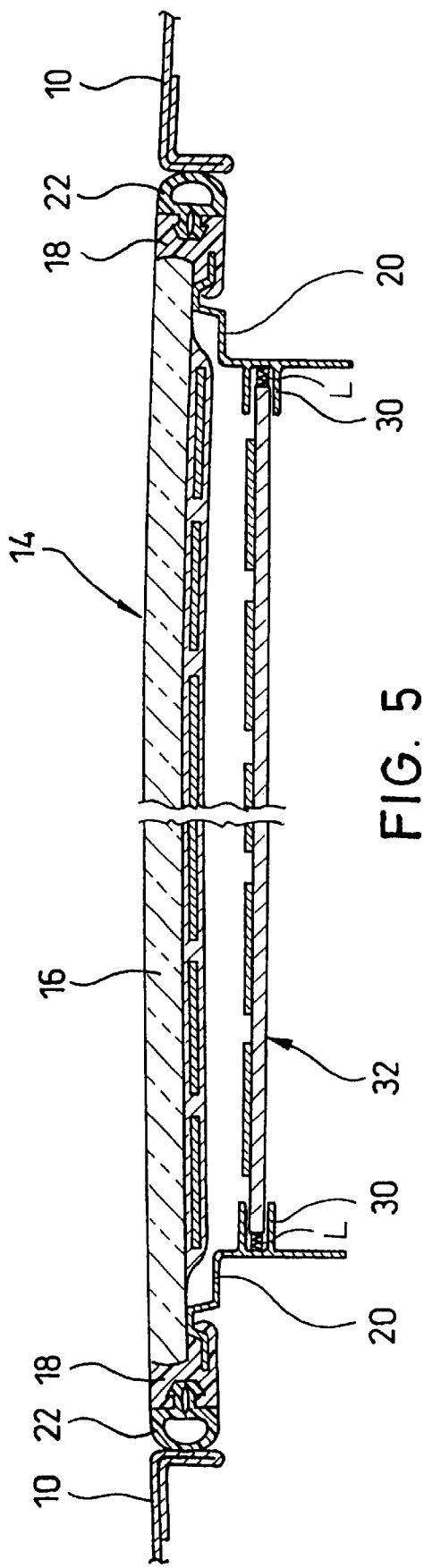
FIG. 5 shows a sectional view of line V—V in FIG. 3.

In addition to the raising function of the cover 14, it can also be provided with a sliding function so that, in the raised state, it can be pushed to the rear so as to expose at least part of the roof opening 12. The sliding headliner 32 and its module 34 are preferably made only for operation with the vehicle stationary, i.e., the sliding headliner 32 should only be moved into the working position shown in FIGS. 2 & 4 with the motor vehicle stationary. Such can be achieved in any conventional manner such as by disabling a drive motor for the headliner in response to detection of vehicle motion, e.g., in a manner analogous to that done to prevent opening of the vehicle roof of the 1998 Mercedes Benz SLK 230 automobile while the automobile is being driven. In the working position, the sliding headliner 32 is locked to the cover 14 by means of a lock L schematically depicted in FIG. 5. The sliding headliner 32 can be displaced with respect to the cover 14 manually or by means of an electric motor M (diagrammatically represented in FIG. 3).

In the embodiment described above, the cover 14 and the sliding headliner 32 are permanently connected to one another, i.e., even outside of the working position of the sliding headliner 32. However, embodiments are also contemplated in which the additional solar generator is not part of the sliding headliner, but is made as a separate element which is stored when not in use, for example, in the trunk and only when needed is it manually inserted from the rear into the upwardly raised cover and is removed again when travel is to begin, such being represented diagrammatically in FIG. 1.

In one alternative embodiment, the cover and the sliding headliner can be moved into a raised working position and also can be pushed under the fixed motor vehicle roof to the rear into a passive position in which the roof opening is exposed.

What is claimed is:

1. Motor vehicle roof with a closure element for a roof opening which can be displaced between a closed position and an open position being provided with a primary solar generator, and an additional element having an additional solar generator, wherein the additional solar generator has a working position outside of the vehicle in which the additional solar generator is coupled to the closure element in the open position of the closure element to generate solar current.

2. Motor vehicle roof as claimed in claim 1, wherein the closure element and the additional element are also coupled to one another outside the working position of the additional element.

3. Motor vehicle roof as claimed in claim 2, wherein the closure element is a cover.

4. Motor vehicle roof as claimed in claim 3, wherein the cover in the open position is raised at its rear edge.

5. Motor vehicle roof as claimed in claim 4, wherein the cover is formed by an essentially transparent glass pane with the main solar generator located on top of the pane.

6. Motor vehicle roof as claimed in claim 5, wherein the additional element is a headliner part for concealing the cover from below.

7. Motor vehicle roof as claimed in claim 6, wherein the headliner part is formed by an essentially opaque carrier with the additional solar generator located on top of the carrier.

8. Motor vehicle roof as claimed in claim 6, wherein the headliner part is movably guided on a bottom side of the cover.

9. Motor vehicle roof as claimed in claim 8, wherein the headliner part is movable along guide rails which are provided on the bottom side of the cover.

10. Motor vehicle roof as claimed in claim 8, wherein the headliner part is concealed by the cover from above in the closed position of the cover.

11. Motor vehicle roof as claimed in claim 10, wherein the headliner part is located so far to the rear relative to the cover in the working position with the cover opened that the additional solar generator is essentially fully exposed from above.

12. Motor vehicle roof as claimed in claim 1, wherein the closure element and the additional element are coupled to one another only in the working position of the additional element.

13. Motor vehicle roof as claimed in claim 12, wherein the closure element and the additional element are manually connectable to one another.

14. Motor vehicle roof as claimed in claim 13, wherein the closure element is a cover which in the open position is raised at its rear edge, and wherein the additional element is manually insertable from the rear up into the cover when the cover is raised.

15. Motor vehicle roof as claimed in claim 1, wherein the additional element is displaceable by a motor into said working position only when the vehicle stationary.

16. Motor vehicle roof as claimed in claim 1, wherein the closure element and the additional element are provided with electrical contacts which make electrical contact with each other when the additional element is in the working position.

17. Motor vehicle roof as claimed in claim 1, wherein the primary solar generator and the additional solar generator are each formed by a solar module which occupies most of the surface area of the closure element and the additional element, respectively.

18. Motor vehicle roof as claimed in claim 1, wherein the additional element is locked to the closure element in the working position.

* * * * *